(12) United States Patent
Kinderknecht et al.

(10) Patent No.: US 7,354,799 B2
(45) Date of Patent: Apr. 8, 2008

(54) METHODS FOR ANCHORING A SEAL RING TO A SUBSTRATE USING VIAS AND ASSEMBLIES INCLUDING AN ANCHORED SEAL RING

(75) Inventors: Daniel J. Kinderknecht, Chandler, AZ (US); Tony Dambrauskas, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 112 days.

(21) Appl. No.: 11/269,443

(22) Filed: Nov. 8, 2005

(65) Prior Publication Data
US 2007/0105370 A1    May 10, 2007

(51) Int. Cl.
  *H01L 21/00* (2006.01)
  *H01L 29/06* (2006.01)

(52) U.S. Cl. .............. 438/109; 438/110; 438/456; 438/637; 257/623; 257/704; 257/E21.577; 257/E23.193

(58) Field of Classification Search ................ None
See application file for complete search history.

(56) References Cited

U.S. PATENT DOCUMENTS

2003/0227094 A1*  12/2003  Chou et al. ............. 257/778
2006/0252262 A1*  11/2006  Kazemi ................... 438/667
2007/0075445 A1*   4/2007  Gogoi .................. 257/E21.022

* cited by examiner

*Primary Examiner*—Alonzo Chambliss
(74) *Attorney, Agent, or Firm*—Kenneth A. Nelson

(57) ABSTRACT

Disclosed are embodiments of a method for forming a seal ring on a substrate that is anchored to the substrate by a number of vias. Also disclosed are embodiments of an assembly including such an anchored seal ring. In some embodiments, a seal ring may extend around the periphery of a MEMS device and may, in combination with a lid, provide a hermitic cavity enclosing the MEMS device. Other embodiments are described and claimed.

29 Claims, 9 Drawing Sheets

METHODS FOR ANCHORING A SEAL RING TO A SUBSTRATE USING VIAS AND ASSEMBLIES INCLUDING AN ANCHORED SEAL RING

FIELD OF THE INVENTION

The disclosed embodiments relate generally to the manufacture of devices enclosed in a hermetic cavity, such as MEMS devices, and more particularly to methods for anchoring a seal ring to a substrate using vias, as well as devices including such an anchored seal ring.

BACKGROUND OF THE INVENTION

A Micro Electro-Mechanical Systems (MEMS) device comprises a relatively small electro-mechanical device fabricated on a substrate (e.g., a silicon substrate) using process techniques similar to those employed to manufacture integrated circuits. Examples of MEMS devices include sensors (e.g., acceleration sensors) and switches (e.g., RF switches for cell phone applications). Due to their small size, these MEMS devices may be sensitive to contamination from the surrounding environment, as the infiltration of small particulate matter into a MEMS device can severely impact the device's operation. Thus, a MEMS device is typically sealed within a hermetic cavity.

A hermetic cavity for a MEMS device may be created by forming a seal ring around a periphery of the MEMS device and attaching a lid to the seal ring. The seal ring and lid define a cavity surrounding the MEMS device, with the seal ring providing a hermetic seal between the lid and the underlying substrate. However, poor adhesion of the seal ring material (e.g., gold) to the underlying substrate (e.g., silicon) may lead to delamination of the seal ring and/or a low resistance to shear loads. Should the seal ring fail (e.g., due to delamination and/or shearing), the operation of the enclosed MEMS device can be dramatically affected, as noted above.

DETAILED DESCRIPTION OF THE INVENTION

Figure 1:
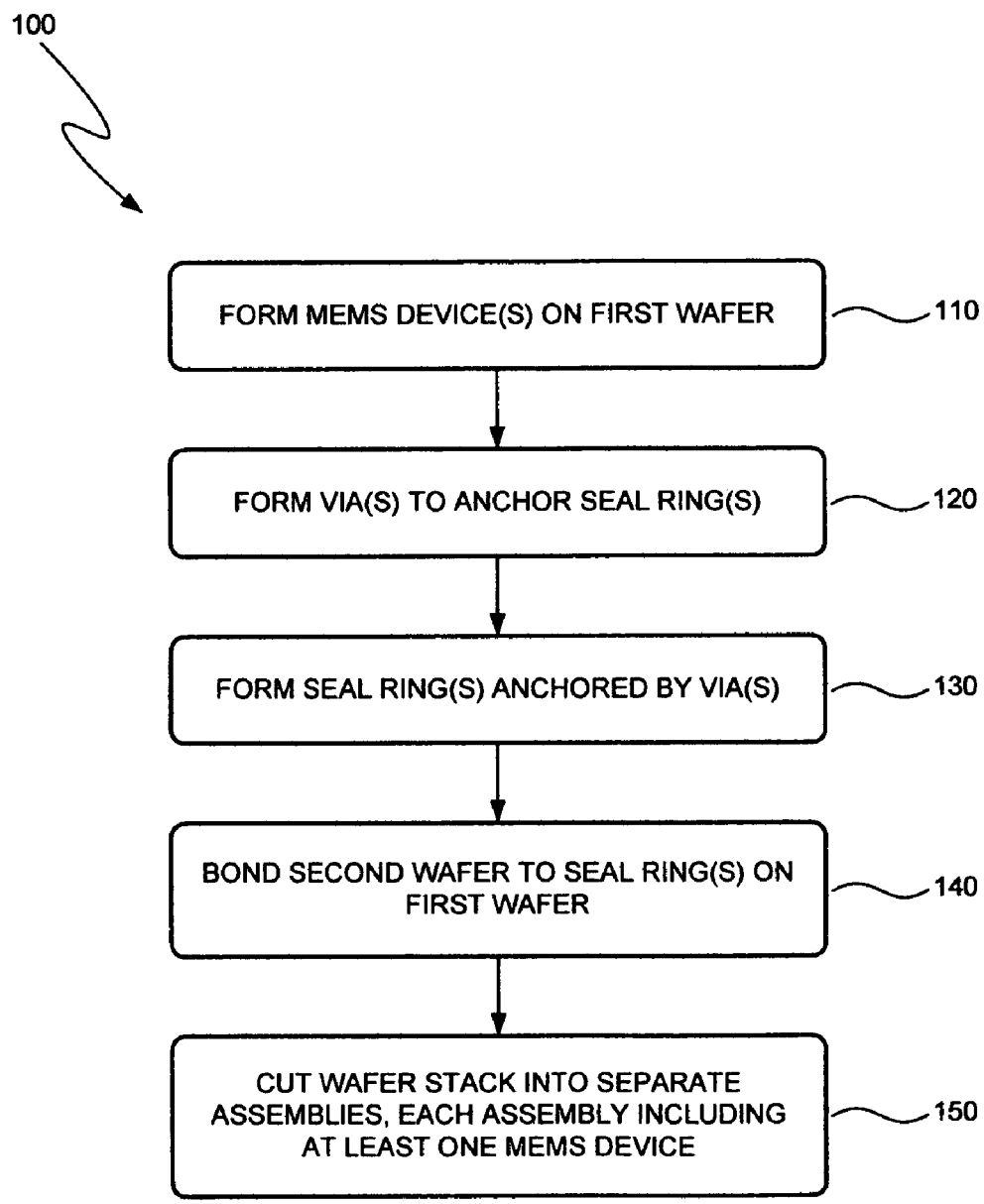
FIG. 1 is a block diagram illustrating an embodiment of a method for fabricating a MEMS device including a seal ring anchored by vias.

Turning now to FIG. 1, illustrated is an embodiment of a method 100 for fabricating a MEMS device including a seal ring anchored by vias. Embodiments of the method 100 shown in FIG. 1 are further illustrated in the schematic diagrams of FIGS. 2A through 2J, and reference should be made to these figures as called out in the text below.

Figure 2A:
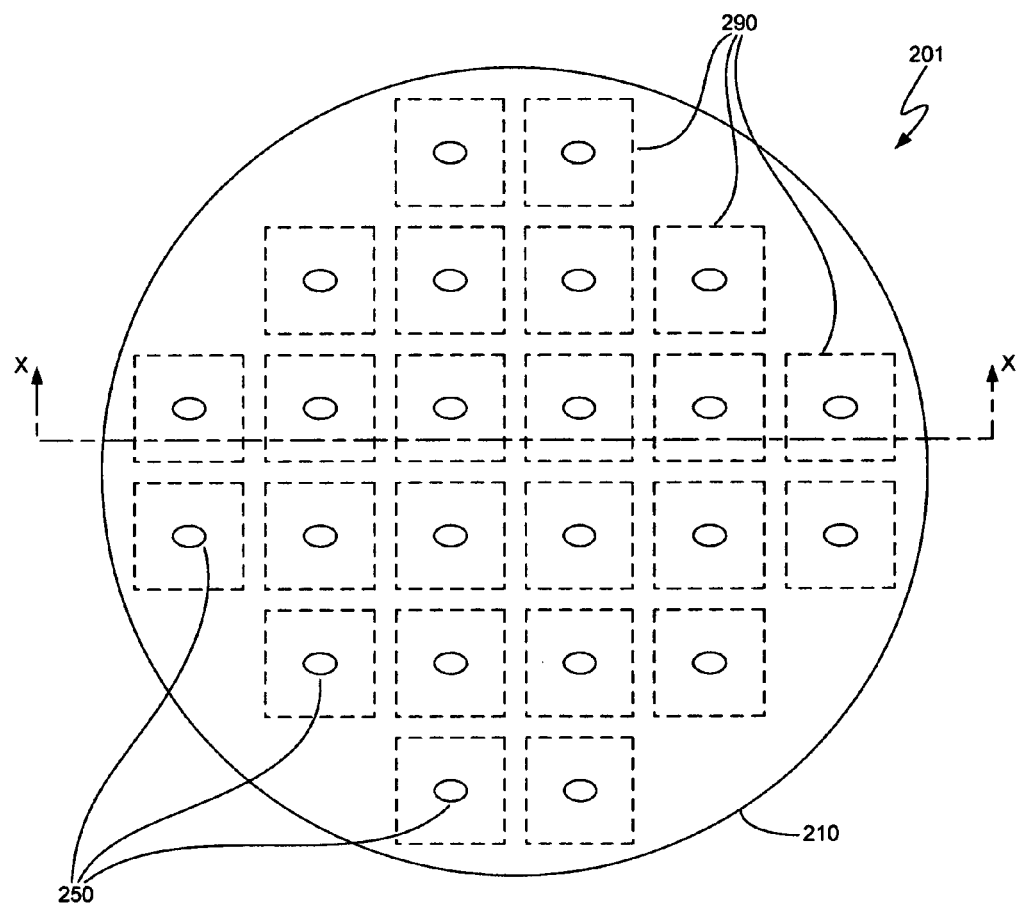
FIGS. 2A-2J are schematic diagrams illustrating embodiments of the method shown in FIG. 1.
Figure 2B:
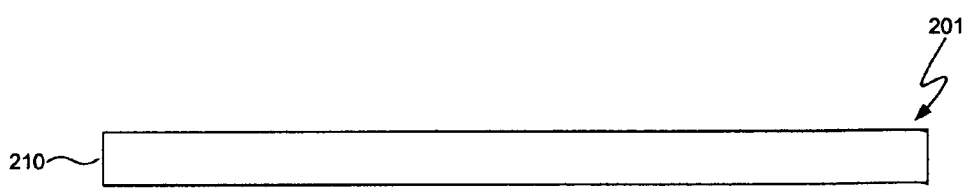

As set forth in block 110 in FIG. 1, one or more MEMS devices are formed on a first wafer. This is illustrated in FIGS. 2A and 2B, which show a first wafer 201. The first wafer 201 comprises a substrate 210, and this substrate may comprise any suitable material or combination of materials upon which a MEMS device (or other device) may be formed. In one embodiment, the substrate 210 comprises silicon. However, it should be understood that the disclosed embodiments are not limited to silicon substrates and, further, that the disclosed embodiments may be practiced with other substrate materials, such as sapphire and glass materials. Formed on the substrate 210 is a number of MEMS devices 250, each of the MEMS devices 250 located on a portion of the substrate 210 corresponding to a die 290 that is to be cut from the wafer 201. It should be understood that, although a relatively small number of die 290 (and MEMS devices 250) are shown in FIGS. 2A-2I for ease of illustration, the wafer 201 may in practice include a greater number of die (e.g., several hundred die).

The MEMS devices 250 may each comprise any desired type, number, and combination of components, and these structures may be formed using any suitable process techniques (e.g., processes similar to those used to fabricate integrated circuits). Also, it should be understood that the disclosed embodiments are not limited in application to MEMS devices and, further, that the disclosed embodiments may find use in any application where it is desired to provide a hermetically sealed cavity or where a seal ring structure is needed (even for non-hermetic applications). Furthermore, the disclosed embodiments are not limited to formation of the MEMS devices 250 directly on substrate 210, and in other embodiments the MEMS devices 250 may be fabricated on other substrates and subsequently bonded to substrate 210.

Figure 2C:
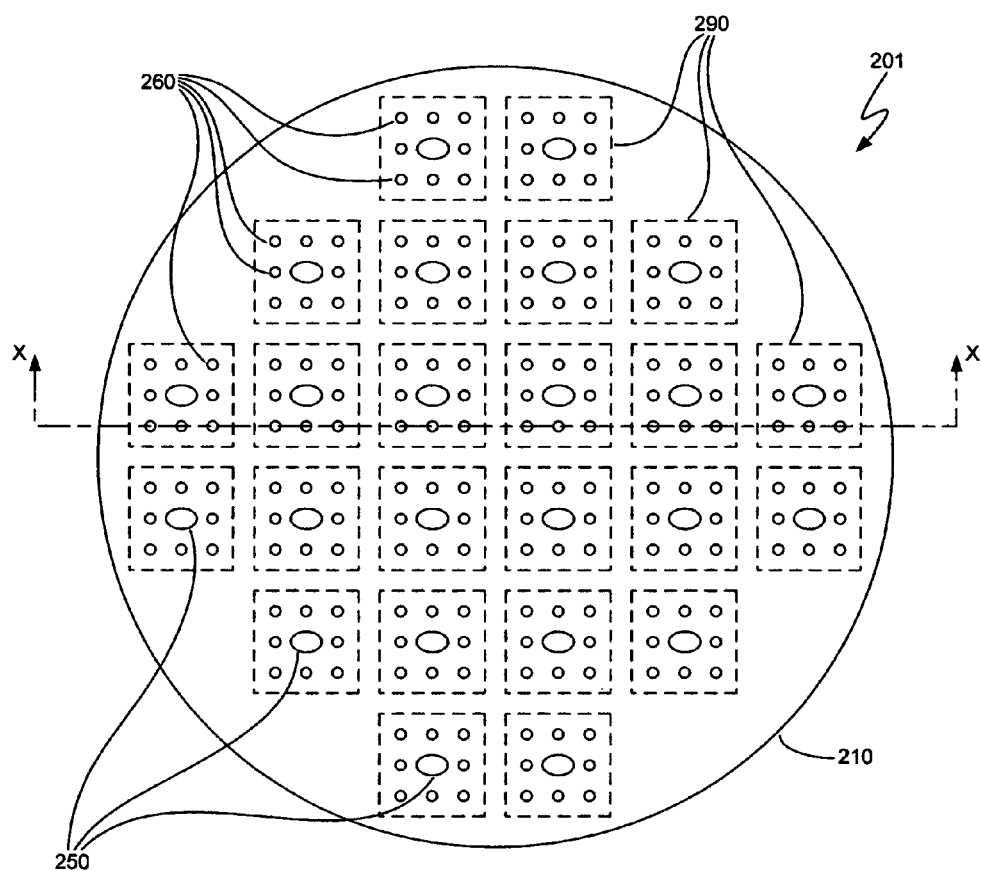
Figure 2D:
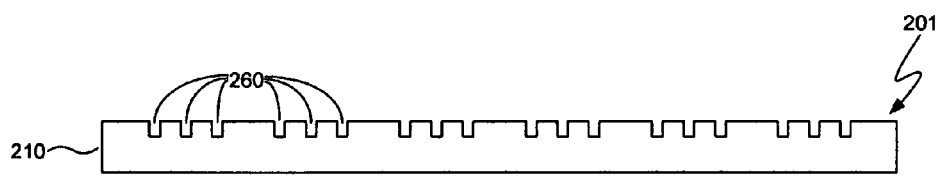
Figure 2E:
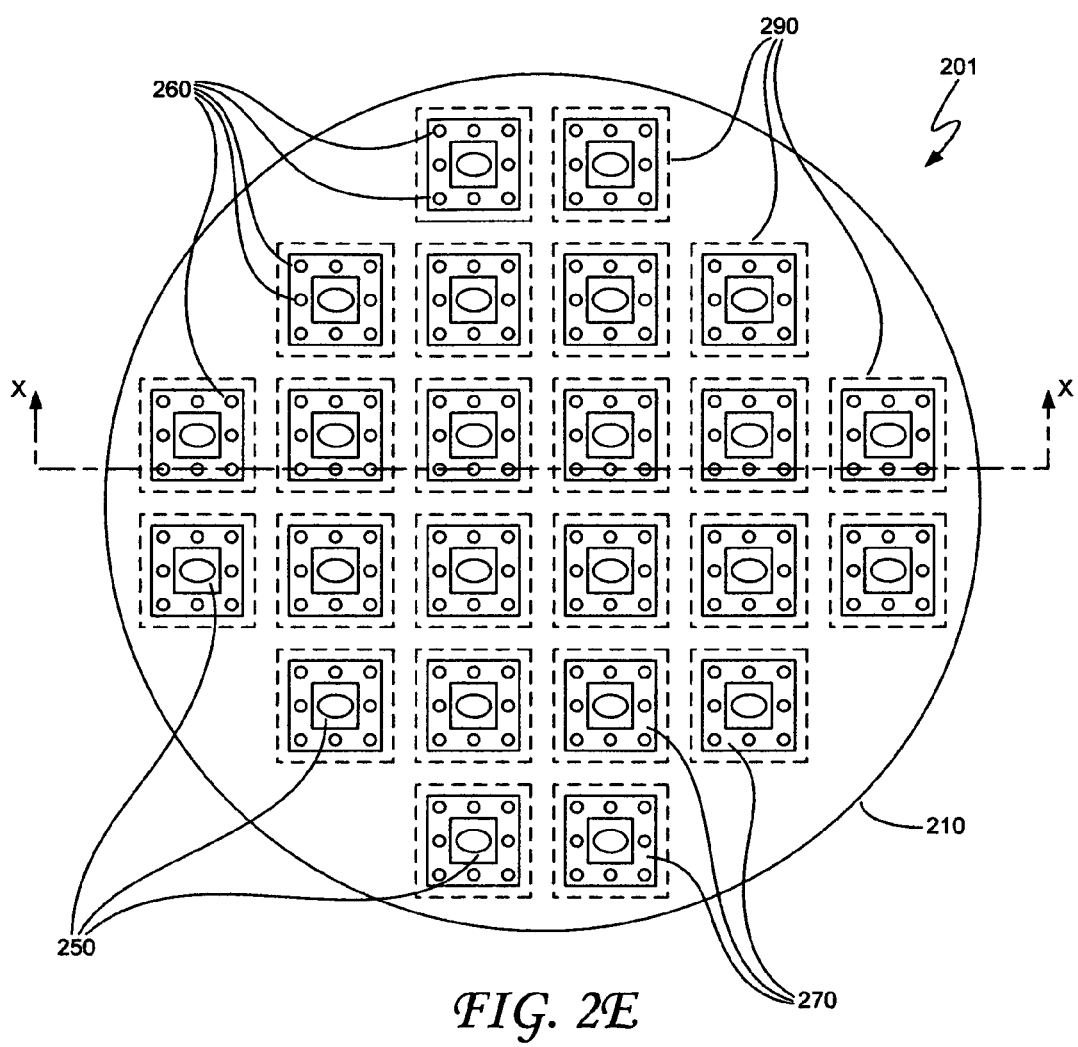
Figure 2F:
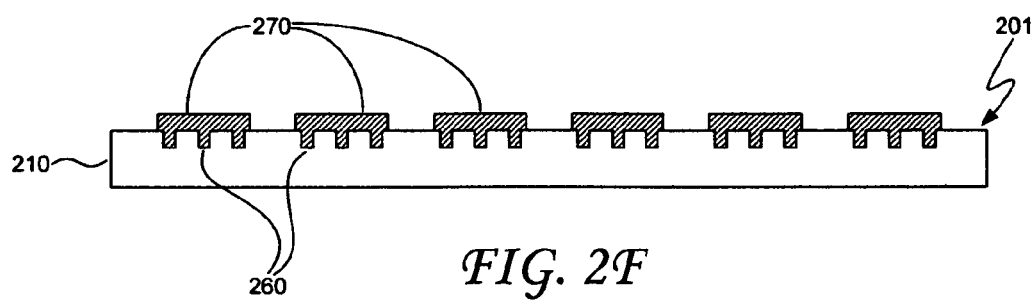
Figure 2G:
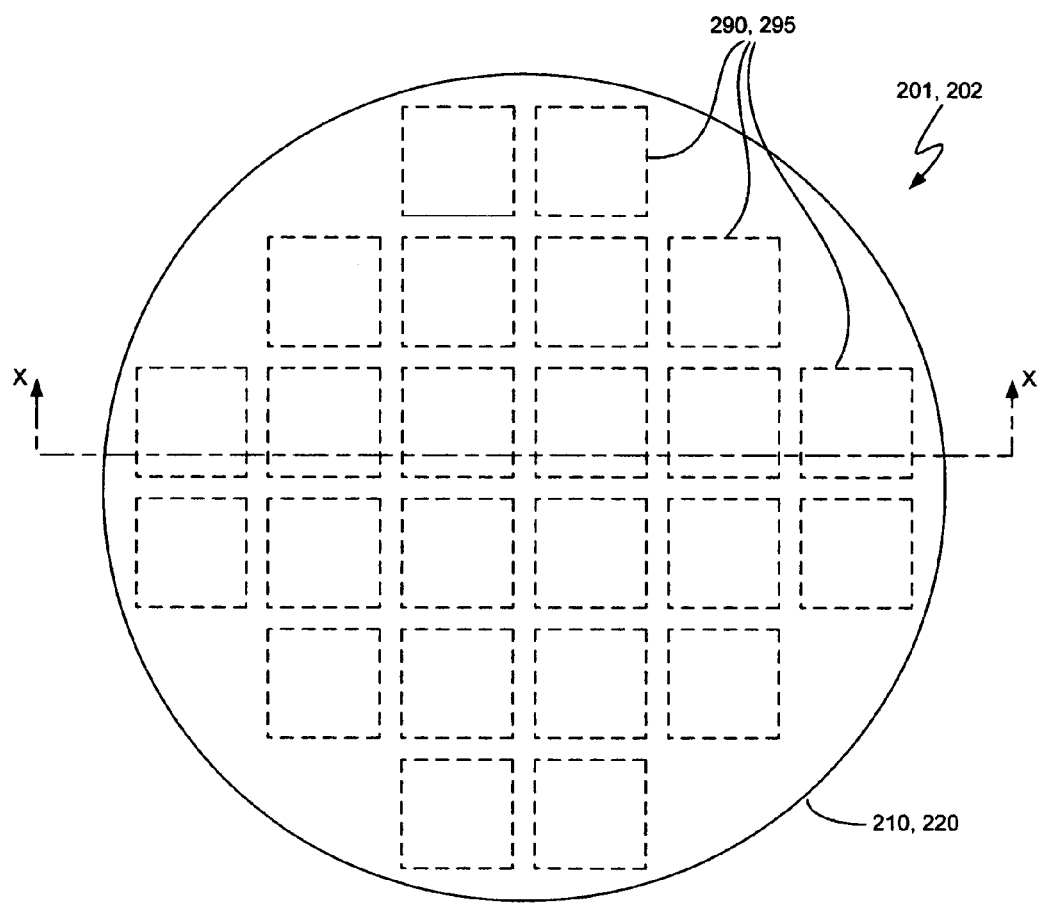
Figure 2H:
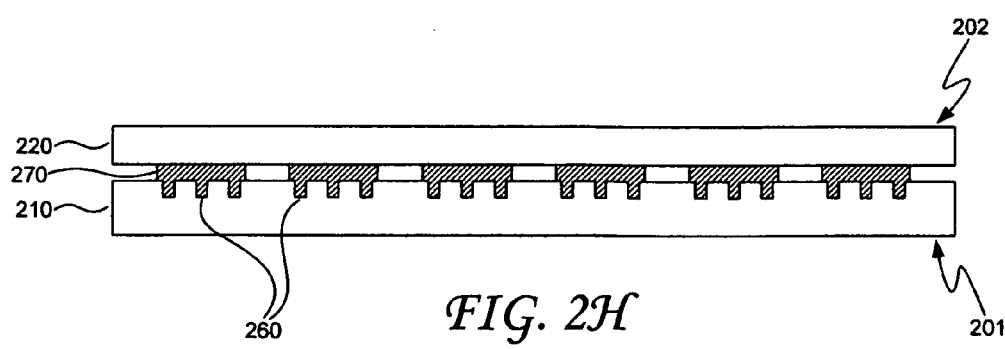
Figure 2I:
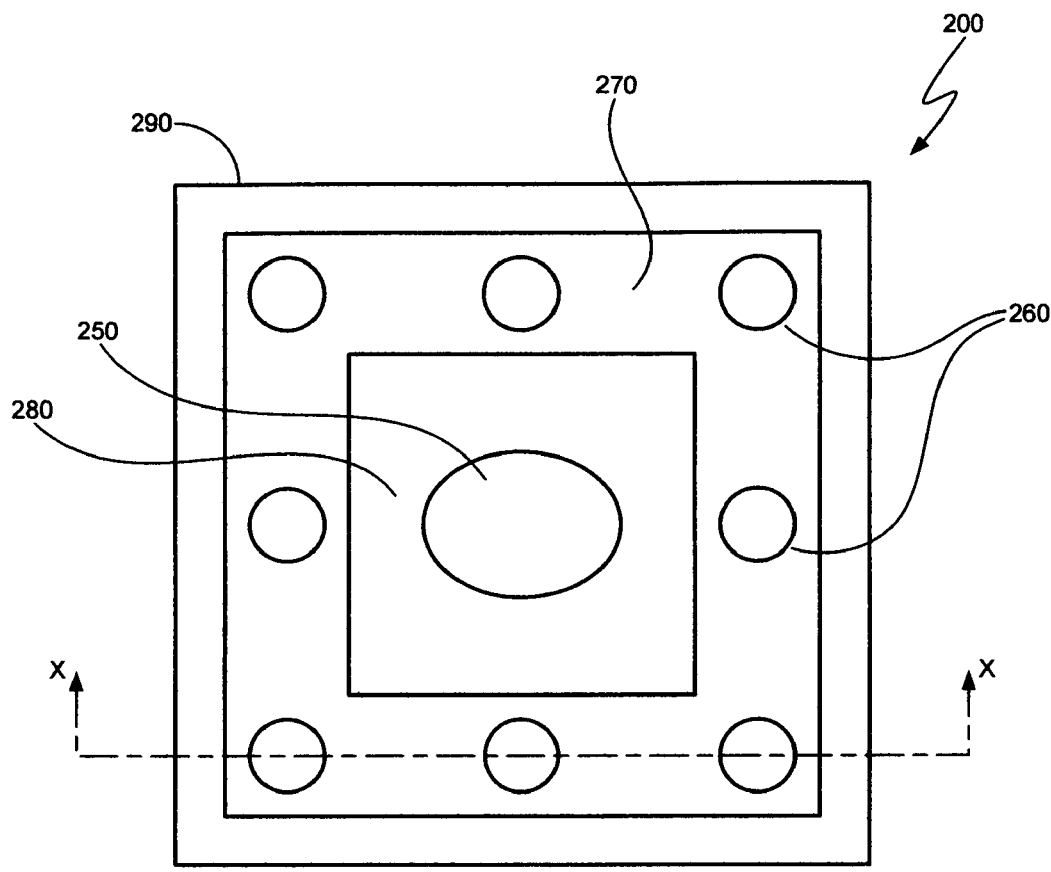
Figure 2J:
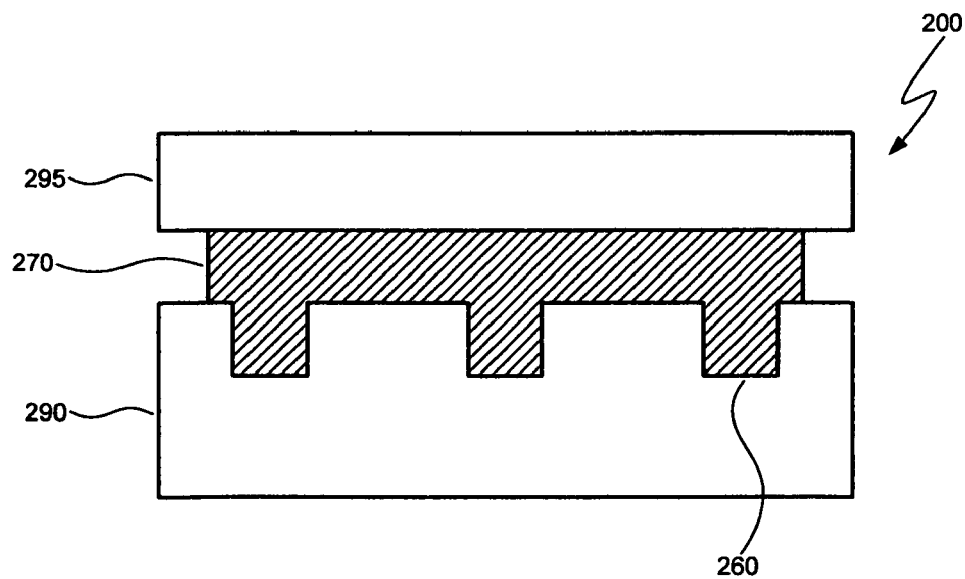

At this juncture, it should be noted that FIG. 2A is a plan view of the wafer 201, whereas shown below this figure in FIG. 2B is a cross-sectional elevation view of the wafer 201, as taken along line X-X in FIG. 2A. This same format is maintained throughout FIGS. 2A-2I, wherein the upper figure (FIGS. 2A, 2C, 2E, 2G, and 2I) provides a plan view and the lower figure (FIGS. 2B, 2D, 2F, 2H, and 2J) provides a cross-sectional elevation view, as taken along line X-X of the plan view. Also, it should be noted that FIGS. 2I and 2J show a single die after singulation.

Returning to FIG. 1, one or more vias are formed to anchor each seal ring that is to be formed on the substrate, as set forth in block 120. This is illustrated in FIGS. 2C and 2D, where vias 260 have been formed on the substrate 210. The vias 260 may be formed using any suitable process, such as laser drilling or etching. A number of the vias 260 are disposed on each die 290 and extend about a periphery of the MEMS device 250 formed on that die. The vias 260 disposed on each die 290 will be used to anchor a seal ring that will subsequently be formed, and any suitable number of vias (e.g., one or more) may be utilized to anchor the seal ring. Also, in the figures, the vias 260 are distributed about each MEMS device 250 in a rectangular pattern and are approximately equidistantly spaced apart. However, it should be understood that the vias 260 surrounding each MEMS device 250 may be disposed in any suitable pattern, whether uniform or non-uniform in spacing.

As set forth in block 130, one or more seal rings are formed on the substrate, each seal ring anchored by one or more of the previously formed vias. This is illustrated in FIGS. 2E and 2F, where a seal ring 270 has been formed on each of the die 290, the seal ring anchored to the substrate by the vias 260 formed on that die. The seal ring 270 on each die 290 extends around the periphery of the MEMS device 250 on that die, and this seal ring may be used to form a hermetic cavity for this device. In one embodiment, as illustrated in the figures, each seal ring 270 extends fully around the associated MEMS device 250; however, in other embodiments, a seal ring may be discontinuous (e.g., there may be gaps in the seal ring). Each seal ring 270 may comprise any suitable material or combination of materials. For example, a seal ring may comprise gold, copper, or alloys of these and/or other metals. Also, a seal ring may comprise multiple layers of different metals (or other materials). Embodiments of a method for fabricating a seal ring anchored to a substrate using vias is described in FIGS. 3 and 4A-4H and the accompanying text below.

The material of each seal ring 270 extends into the underlying vias 260, thereby increasing the overall surface area of the interface between the seal ring and substrate 210. This increase in surface area provides a greater area of adhesion between the seal ring 270 and substrate 210. Also, due to the increased surface area at the interface between the seal ring 270 and substrate 210 provided by the vias 260, the width of the seal ring may be decreased, if desired, while still maintaining adequate contact between the seal ring and substrate. In addition, because the seal ring 270 extends into the underlying vias 260, the seal ring structure may have increased sheer strength.

As set forth in block 140 of FIG. 1, a second wafer is bonded to the seal rings on the first wafer. This is illustrated in FIGS. 2G and 2H, where a second wafer 202 has been bonded to the seal rings 270 on the first wafer 201 to form a wafer stack. A portion of the second wafer 201 provides a lid 295 for the MEMS device 250 located on each of the underlying die 290 on first wafer 201. The second wafer 202 comprises a substrate 220, and this substrate may comprise any suitable material or combination of materials that can function as a lid for a MEMS device 250 (or other device). In one embodiment, the substrate 220 comprises silicon; however, it should be understood that the second wafer 202 may comprise other suitable materials (e.g., sapphire, glass, etc.).

The second wafer 202 may be bonded to the seal rings 270 on first wafer 201 using any suitable method, such as diffusion bonding, thermo-compression bonding, or a reflow process. According to one embodiment, the second wafer 202 may also include mating seal rings or other structures (not shown in the figures), and these mating structures may also be anchored to the second wafer by vias. In one embodiment, the interface between the second wafer 202 (and the lids 295 to be cut from this wafer) and each of the seal rings 270 provides a hermetic seal. However, in other embodiments, the interface between the second wafer 202 (and the lids 295) may be non-hermetic.

Referring to block 150 in FIG. 1, the wafer stack is cut into separate assemblies, each assembly including a die having at least one MEMS device surrounded by an anchored seal ring coupled with an associated lid. This is illustrated in FIGS. 2I and 2J, which shows an assembly 200. The assembly 200 includes a die 290 and an associated lid 295, the die 290 including one of the MEMS devices 250. The lid 295 is bonded to the seal ring 270, and the interface between the lid and seal ring, as well as the interface between the seal ring and underlying substrate, may provide a hermetic cavity 280 for the MEMS device 250. Note that, for clarity and ease of understanding, the assembly 200 is shown in FIG. 2I without the lid 295.

Figure 3:
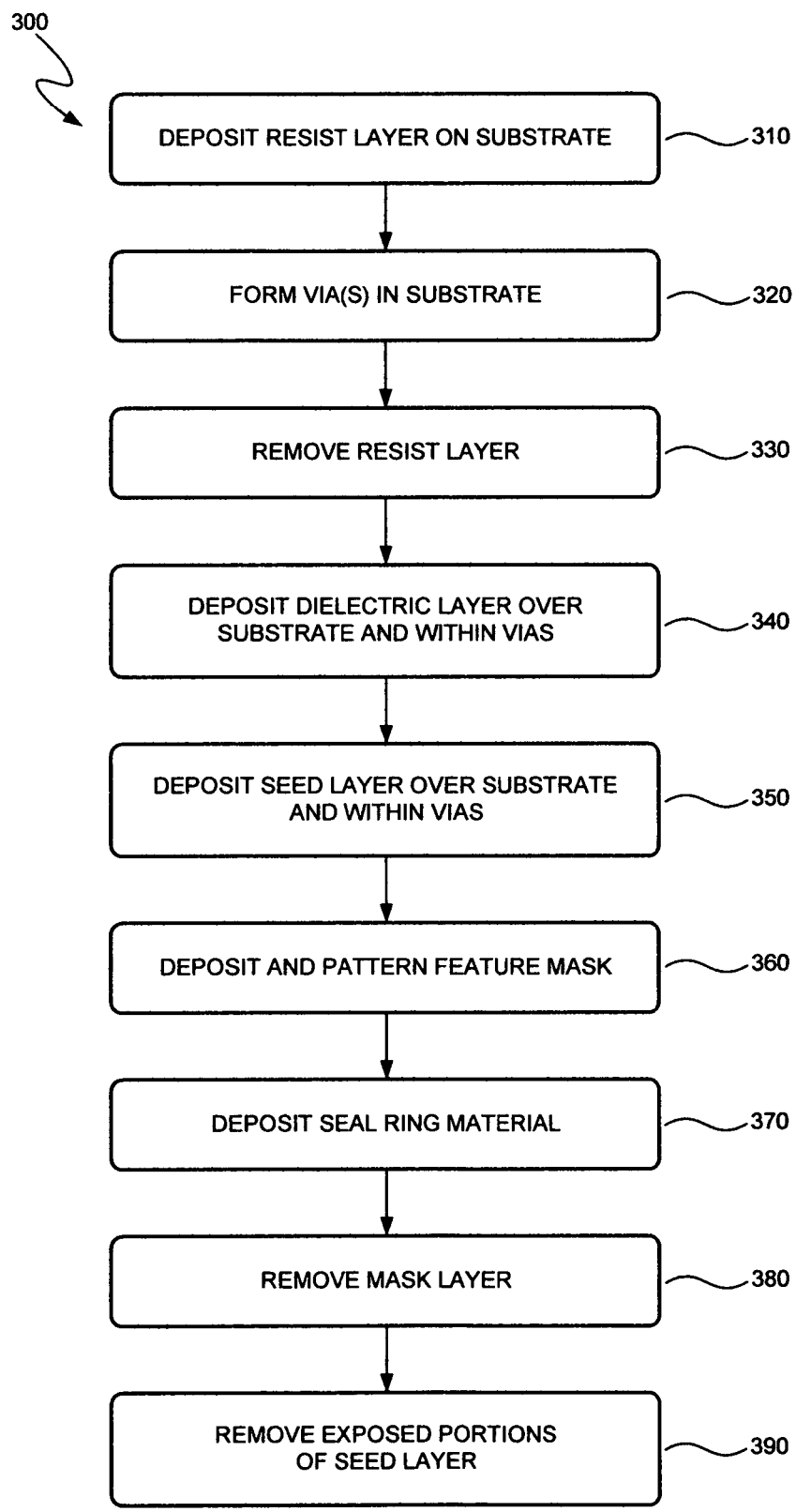
FIG. 3 is a block diagram illustrating an embodiment of a method for fabricating a seal ring anchored to a substrate using vias.

Turning now to FIG. 3, illustrated is an embodiment of a method 300 for fabricating a seal ring anchored to a substrate using vias. Embodiments of the method 300 shown in FIG. 3 are further illustrated in the schematic diagrams of FIGS. 4A through 4H, and reference should be made to these figures as called out in the text below. It should be noted that the above-described embodiments of a method for fabricating a MEMS device including a seal ring anchored by vias—as well as the embodiments of an assembly including such an anchored seal ring—are not limited to formation by the method 300 of FIG. 3 and, further, that any other suitable process may be employed to form a seal ring anchored by vias.

Figure 4A:
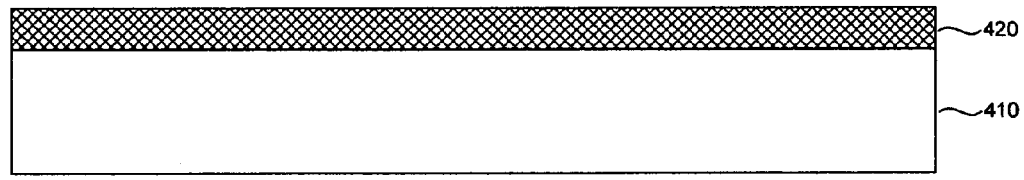
FIGS. 4A-4H are schematic diagrams illustrating embodiments of the method shown in FIG. 3.

Referring to block 310 in FIG. 3, in one embodiment, a layer of a resist material is deposited on a substrate. This is illustrated in FIG. 4A, which shows a substrate 410 and a layer of resist 420 disposed over the substrate. Although not shown in FIGS. 4A-4H, one or more MEMS devices (or other devices) may be formed on the substrate 410. The substrate 410 may comprise any suitable material or combination of materials upon which a MEMS device (or other device) may be formed. In one embodiment, the substrate 410 comprises silicon. However, it should be understood that the disclosed embodiments are not limited to silicon substrates and, further, that the disclosed embodiments may be practiced with other substrate materials, such as sapphire and glass materials.

The resist layer 420 may comprise any suitable material. In one embodiment, the resist layer 420 comprises a material capable of being deposited using a spin-on process. According to one embodiment, a number of vias are to be formed on the substrate 410 by laser drilling, and the resist layer 420 provides a protective layer for the substrate (and any devices and/or circuitry formed thereon) during laser ablation. According to another embodiment, a number of vias are to be formed on the substrate 410 by an etching process, and the resist layer 420 is patterned to define the locations of these vias.

Figure 4B:
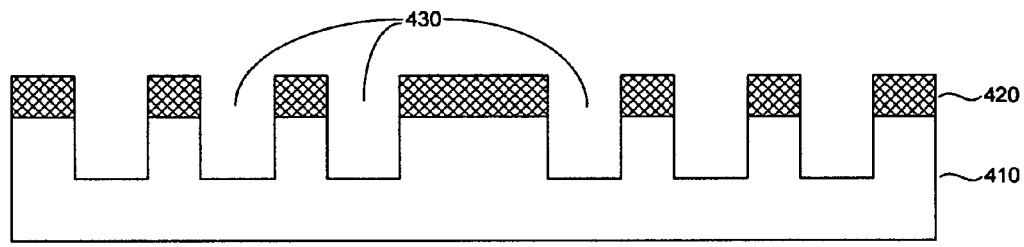

As set forth in block 320, vias are formed in the substrate. This is illustrated in FIG. 4B, where a plurality of vias 430 have been formed in substrate 410. Any suitable number and arrangement of vias may be formed on the substrate. In one embodiment, a number of the vias 430 are arranged in a pattern proximate to a MEMS device on the substrate 410, and this pattern of vias will be used to anchor a seal ring to the substrate. According to one embodiment, a number of the vias are arranged in an approximately uniformly spaced pattern (e.g., a rectangular pattern) around a periphery of the MEMS device; however, in other embodiments the vias are not equidistantly spaced apart. Also, the vias may be arranged in any other suitable pattern (e.g., circular).

The vias 430 may be formed using any suitable technique. In one embodiment, the vias 430 are formed using a laser drilling process. Where laser drilling is used for via formation, the resist layer 420 may function as a protective layer, as noted above. In another embodiment, the vias 430 are formed using an etching process, such as deep reactive ion etching (DRIE). Where etching is employed for via formation, the resist layer 420 may be patterned (e.g., by photolithography techniques) to define the locations of the vias, as also noted above. The vias may have any suitable depth. According to one embodiment, the vias have a depth of between approximately 10 μm and 100 μm. Also, the vias 430 may have any suitable aspect ratio (e.g., the ratio of the via's depth to it's diameter), and in one embodiment the vias have an aspect ratio of up to approximately 10 to 1.

Figure 4C:
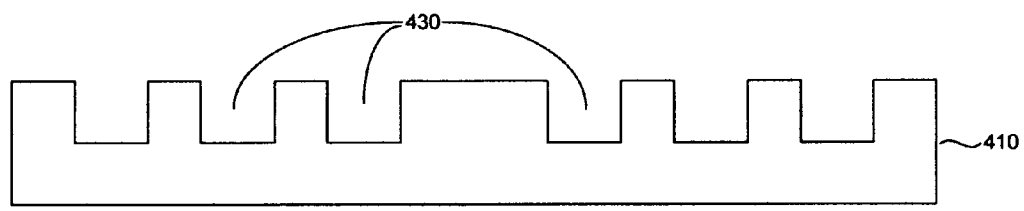
Figure 4D:
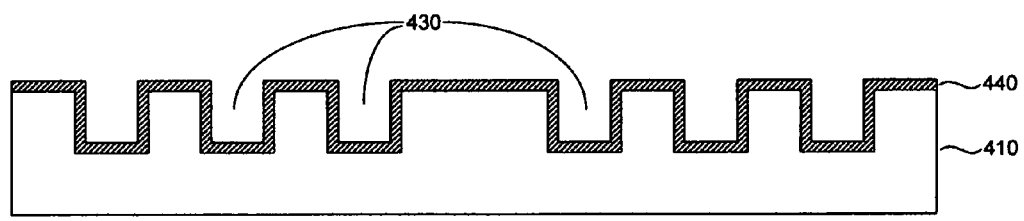

Referring to block 330 in FIG. 3, the resist layer is removed. This is illustrated in FIG. 4C, where the resist layer 420 has been removed from substrate 410, leaving vias 430 extending into the substrate. Any suitable method may be employed to strip away the resist layer 420.

According to one embodiment, a layer of dielectric material is then deposited or formed over the substrate and within the vias, as set forth in block 340. This is illustrated in FIG.

4D, where a layer of dielectric material 440 has been formed on the substrate 410 and over the walls of vias 430. The dielectric layer 440 may comprise any suitable dielectric material, such as an oxide material (e.g., $SiO_2$), a nitride material (e.g., silicon nitride), or a polymer material. Also, the dielectric layer 440 may be formed using any suitable blanket deposition or formation technique. Further, the dielectric layer 440 may have any suitable thickness, and in one embodiment the dielectric layer has a thickness in a range of approximately 500 Angstroms to 10,000 Angstroms.

Figure 4E:
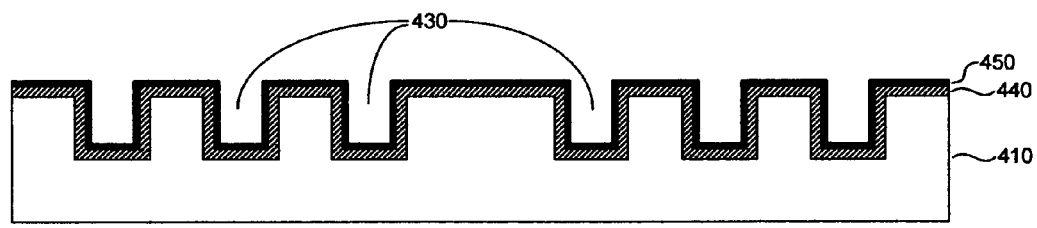

According to another embodiment, a seed layer is deposited over the dielectric layer and within the vias, as set forth in block 350. This is illustrated in FIG. 4E, where a seed layer 450 has been deposited or formed over the dielectric layer 440. The seed layer, which may facilitate the subsequent deposition of a seal ring material, may comprise any suitable material. For example, should the seal ring material comprise gold or a gold alloy, the seed layer 450 may comprise copper, chromium, or nickel, as well as alloys of these and/or other metals. By way of further example, should the seal ring material comprise copper, the seed layer 450 may comprise copper or titanium, as well as alloys of these and/or other metals. The seed layer 450 may be deposited using any suitable blanket deposition technique, such as a sputtering or chemical vapor deposition (CVD). Also, the seed layer 450 may have any suitable thickness, and in one embodiment the seed layer has a thickness up to approximately 11,000 Angstroms.

Figure 4F:
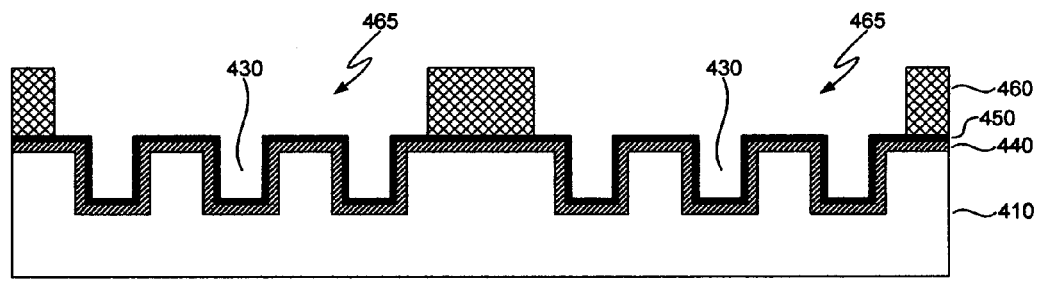

Referring to block 360, a layer of resist material is deposited and patterned to form a feature mask, this feature mask defining the shape and location of one or more seal rings that are to be formed. This is illustrated in FIG. 4F, where a layer of resist material 460 has been deposited over the substrate 410 and then patterned (e.g., by photolithography techniques) to define a number of apertures 465, each aperture defining the shape and location of a seal ring. The resist material 460 may comprise any suitable material, and in one embodiment the resist layer 460 comprises a material capable of being deposited using a spin-on process.

Figure 4G:
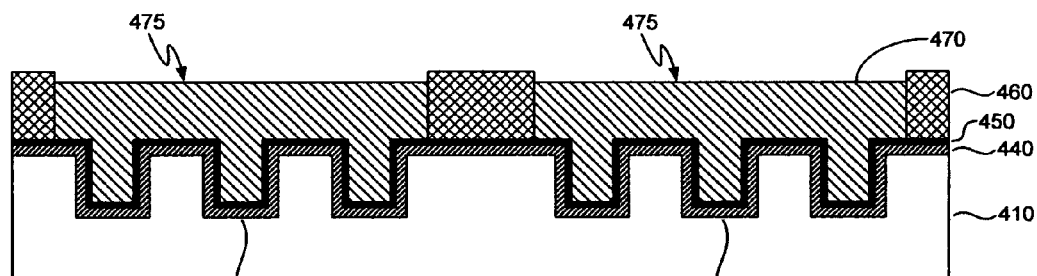

As set forth in block 370, a seal ring material is deposited to form one or more seal rings. This is illustrated in FIG. 4G, where a seal ring material 470 has been deposited to form seal rings 475. The seal ring material 470 may comprise any suitable material or combination of materials. For example, the seal ring material 470 may comprise gold, copper, or alloys of these and/or other metals. Also, a seal ring may comprise multiple layers of different metals (or other materials). Seal ring material 470 may be deposited using any suitable deposition process. According to one embodiment, the seal ring material 470 is deposited using an electroplating process. In another embodiment, the seal ring material is deposited using an electroless plating process. In yet a further embodiment, the seal ring material is deposited using a blanket deposition technique (and perhaps is subsequently planarized). The seal ring material layer 470 may have any suitable thickness, depending upon the size of the associated MEMS devices. In one embodiment, the seal ring material layer 470 has a thickness up to approximately 100 µm.

Figure 4H:
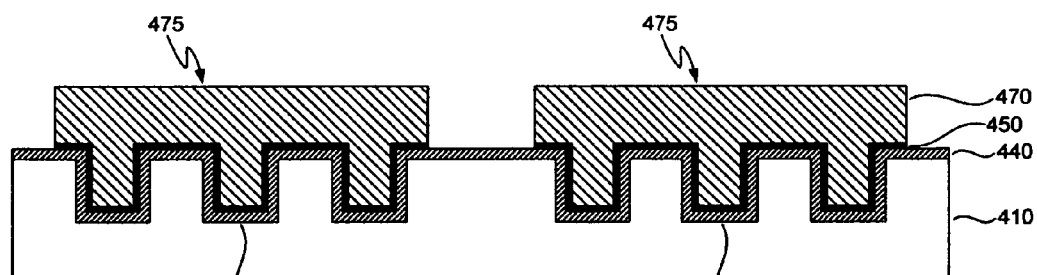

With reference to blocks 380 and 390 in FIG. 3, the mask layer and exposed portions of the seed layer may be removed. This is illustrated in FIG. 4H, where the mask layer 460 has been removed, and exposed portions (e.g., those portion not underlying a seal ring 475) of the seed layer 450 have also been removed. Any suitable techniques may be employed to strip away the resist layer 460 and to remove exposed portions of the seed layer 450, respectively.

After removal of the resist layer 460 (and exposed portions of the seed layer 450), seal ring features 475 remain on substrate 410. Each of these seal rings 475 may be bonded with a lid (which may also include a mating seal ring) to form a hermetic cavity for the enclosed MEMS device, as described above.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method comprising:
   forming a plurality of devices on a first wafer;
   forming a number of vias in the first wafer proximate a periphery of each of the devices;
   forming a plurality of seal rings on the first wafer, each of the seal rings disposed proximate the periphery of one of the devices and extending into the number of vias located proximate that device; and
   bonding a second wafer to the seal rings formed on the first wafer to form a wafer stack.

2. The method of claim 1, further comprising cutting the wafer stack into a number of assemblies, each assembly including at least one of the devices and the associated seal ring.

3. A method comprising:
   forming a plurality of devices on a first wafer;
   forming a number of vias in the first wafer proximate a periphery of each of the devices; and
   forming a plurality of seal rings on the first wafer, each of the seal rings disposed proximate the periphery of one of the devices and extending into the number of vias located proximate that device, wherein each of the devices comprises at least one Micro Electro-Mechanical Systems (MEMS) devices.

4. The method of claim 1, wherein the first wafer comprises silicon.

5. The method of claim 4, wherein each of the seal rings comprises a material selected from a group consisting of gold, gold alloys, copper, and copper alloys.

6. The method of claim 4, wherein the second wafer comprises silicon.

7. An assembly comprising:
   a substrate having an upper surface;
   a device disposed on the upper surface of the substrate;
   a number of vias extending into the substrate and located proximate a periphery of the device;
   a seal ring disposed proximate the periphery of the device and extending into the number of vias; and
   a lid coupled with the seal ring.

8. The assembly of claim 7, wherein the lid includes a seal ring, the seal ring on the lid bonded to the seal ring on the substrate.

9. The assembly of claim 8, wherein the lid includes a number of vias and the seal ring on the lid extends into the number of vias on the lid.

10. The assembly of claim 7, wherein the substrate comprises silicon.

11. The assembly of claim 10, wherein the seal ring comprises a material selected from a group consisting of gold, gold alloys, copper, and copper alloys.

12. The assembly of claim 10, wherein the lid comprises silicon.

13. The assembly of claim 7, wherein the device comprises at least one Micro Electro-Mechanical Systems (MEMS) device.

14. A method comprising:
forming a number of vias on a substrate;
depositing a layer of a dielectric material over the substrate and within the vias;
forming a mask on the substrate, the mask including an aperture overlying the number of vias;
depositing a layer of a second material within the mask aperture and over the dielectric layer, the second material layer extending into the vias; and
removing the mask, wherein the second material layer comprises a seal ring.

15. The method of claim 14, wherein the number of vias are formed using a laser.

16. The method of claim 14, wherein the number of vias are formed using an etching process.

17. The method of claim 14, further comprising depositing a layer of a resist material prior to formation of the vias.

18. The method of claim 14, further comprising depositing a seed layer prior to deposition of the second material.

19. The method of claim 18, further comprising removing exposed portions of the seed layer after removal of the mask.

20. The method of claim 14, wherein the seal ring extends around a periphery of a device formed on the substrate.

21. The method of claim 20, wherein the device comprises at least one Micro Electro-Mechanical Systems (MEMS) device.

22. The method of claim 14, wherein the substrate comprises silicon.

23. The method of claim 14, wherein the second material comprises a material selected from a group consisting of gold, gold alloys, copper, and copper alloys.

24. A method comprising:
anchoring a seal ring to a substrate using a number of vias, each via extending into the substrate, the seal ring to couple with a lid;
wherein a space within the seal ring between the substrate and lid, when coupled with the seal ring, provides a cavity to enclose a device.

25. The method of claim 24, wherein the cavity is hermetically sealed.

26. The method of claim 24, wherein the device comprises a Micro Electro-Mechanical Systems (MEMS) device.

27. An assembly comprising:
a substrate;
a seal ring anchored to the substrate by a number of vias, each via extending into the substrate; and
a lid coupled with the seal ring, wherein a space within the seal ring between the substrate and lid provides a cavity to enclose a device.

28. The assembly of claim 27, wherein the cavity is hermetically sealed.

29. The assembly of claim 27, wherein the devices comprises a Micro Electro-Mechanical Systems (MEMS) device.

* * * * *